United States Patent
An et al.

(10) Patent No.: US 7,871,904 B2
(45) Date of Patent: Jan. 18, 2011

(54) WAFER PROCESSING METHOD FOR IMPROVING GETTERING CAPABILITIES OF WAFERS MADE THEREFROM

(75) Inventors: Jeong Hoon An, Gyeonggi-do (KR); Byeong Sam Moon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 36 days.

(21) Appl. No.: 12/492,260

(22) Filed: Jun. 26, 2009

(65) Prior Publication Data
US 2010/0009520 A1    Jan. 14, 2010

(30) Foreign Application Priority Data
Jul. 10, 2008    (KR) .................. 10-2008-0067228

(51) Int. Cl.
*H01L 21/322* (2006.01)
(52) U.S. Cl. ................ 438/473; 257/E27.112
(58) Field of Classification Search ........ 438/471, 438/473, 479, 967, FOR. 457; 257/E27.112, 257/E21.32, E21.561
See application file for complete search history.

(56) References Cited

U.S. PATENT DOCUMENTS 5,738,942 A * 4/1998 Kubota et al. ............... 428/428
7,294,561 B2 * 11/2007 Erokhin et al. ............. 438/473

FOREIGN PATENT DOCUMENTS

KR    1020030059492 A    7/2003

* cited by examiner

*Primary Examiner*—Brook Kebede
(74) *Attorney, Agent, or Firm*—Ladas & Parry LLP

(57) ABSTRACT

A wafer processing method for improving gettering capabilities of wafers made therefrom is presented. The method includes the steps of preparing, annealing and ion-implanting. The preparing step involves preparing the wafer from a silicon ingot. The annealing step involves forming first gettering sites in both sides of the wafer by annealing the wafer. The ion-implanting step involves forming second gettering sites in a back side of the wafer in which the first gettering sites are already formed.

10 Claims, 3 Drawing Sheets

Implanting

WAFER PROCESSING METHOD FOR IMPROVING GETTERING CAPABILITIES OF WAFERS MADE THEREFROM

CROSS-REFERENCE TO RELATED APPLICATIONS

The present application claims priority to Korean patent application number 10-2008-0067228 filed on Jul. 10, 2008, which is incorporated herein by reference in its entirety.

BACKGROUND OF THE INVENTION

The present invention relates to a wafer processing method, and more particularly, to a wafer processing method which can improve the gettering characteristics of a wafer and reduce the total processing cost of the wafer.

When processing a silicon wafer, if the wafer is contaminated with metal impurities, in particular, transition metal impurities, through exposure brought about by various processes, and then the manufacturing yield and the reliability of a semiconductor device can decrease. This is because the metal impurities infiltrate and diffuse throughout the silicon wafer can subsequently compromise the performance of the resultant components in the silicon wafer. Metal impurities can infiltrate in to oxide layers and compromise the integrity of the insulative character of oxide layers. Metal impurities can also infiltrate and cause crystal defects. Metal impurities can also serve as deep level impurities. The insulation breakdown field strength of a gate oxide layer decreases as the amount of metal contamination increases. As the crystalline density of the oxide layer increases the allowable impurity concentration decreases due to thin-filming of the oxide layer.

Under these situations, various methods for minimizing contamination of a wafer by metal impurities have been proposed in the art. Recently, gettering technology for adsorbing metal impurities in the wafer itself is widely used.

The gettering is a technique of sequestering metal impurities away from active areas. Oftentimes gettering involves moving the metal impurities from the active region of the wafer to the bulk or the back side of the wafer. The procedure of the gettering technology generally involves a first step of releasing metal impurities from their places, a second step of diffusing the metal impurities to the bulk or the back side of the wafer, and a third step of capturing or sequestering the metal impurities at a gettering site away from the active region.

One particular mechanism of the gettering technology can be divided into segregation-induced gettering phase in which an ion-implantation layer, having an increased impurity solubility, is formed by doping boron adjacent to crystal defects at a high concentration so that metal impurities can be gathered to the ion-implantation layer. This is then followed by a relaxation-induced gettering phase that exploits the rapid diffusion characteristics of transition metal impurities in the wafer.

It is thought that the relaxation-induced gettering that exploits the rapid diffusion characteristics of transition metal impurities in the wafer can be divided into an intrinsic gettering (IG) method and an extrinsic gettering (EG) method. The intrinsic gettering (IG) method adopts a DZ (denuded zone) or a natural scheme. The extrinsic gettering (EG) method adopts a PBS (poly back seal), sand blast, laser or a ring.

However, while not shown in a drawing and not explained in detail, in the conventional gettering methods using IG and EG, while conducting a process, unwanted particles are likely to be produced by high pressure injection and high temperature annealing, so the continuity of gettering effect is degraded.

Also, due to the different physical properties of the transition metal impurities such as Fe, Ni and Cu in the wafer, limitations exist in using only one gettering method. As a result it can become difficult or impossible to accomplish a satisfactory sequestering of all of these various impurities along the gettering sites scattered over the entire area of the wafer.

Further, even if gettering can be successfully obtained in the initial stage of a process for forming devices, high temperature annealing implemented for extended periods and various other subsequent wafer forming processes, may result in deteriorating the efficiency of the initial gettering sequestration. Moreover, as one more additional layer is deposited, the manufacturing cost necessarily increases.

In order to cope with these problems, a method of forming a gettering site on the back side of the wafer to improve the gettering characteristics has been proposed. Nevertheless, even in this case, because the gettering site wafer can costs about 1.8 times higher than a normal wafer, the cost of the entire wafer forming processes increases.

Therefore, a method capable of improving gettering characteristics while decreasing the cost of entire wafer forming processes is keenly demanded in the art.

BRIEF SUMMARY OF THE INVENTION

Embodiments of the present invention are directed to a wafer processing method which can improve the gettering characteristics of a wafer and reduce the cost of entire wafer forming processes.

In an aspect of the present invention, a wafer processing method comprises the steps of forming a wafer from a silicon ingot; forming first gettering sites in both sides of the wafer by annealing the wafer; and forming a second gettering site in a back side of the wafer in which the first gettering site is formed, through an ion-implantation process.

Annealing is conducted at a temperature of about 900~1,350° C.

Annealing is conducted under an atmosphere of Ar, $N_2$ and $NH_3$.

Annealing is conducted as RTA (rapid thermal annealing).

The ion-implantation process is conducted using boron (B) ions.

The ion-implantation process is conducted for the back side of the wafer.

The ion-implantation process is conducted at a concentration of about $10^{19}$~$10^{25}$ atoms/cm$^3$.

The second gettering site is formed at a depth of approximately 0.25~0.80 μm from the back side of the wafer.

After the step of forming the first gettering sites and before the step of forming the second gettering site, the method further comprises the step of conducting a both side grinding process for the wafer formed with the first gettering sites.

After the step of forming the second gettering site, the method further comprises the step of conducting a polishing process for a front side of the wafer formed with the second gettering site.

DESCRIPTION OF SPECIFIC EMBODIMENT

Hereafter, a specific embodiment of the present invention will be described in detail with reference to the accompanying drawings. It is understood herein that the drawings are not necessarily to scale and in some instances proportions may have been exaggerated in order to more clearly depict certain features of the invention.

Figure 1:
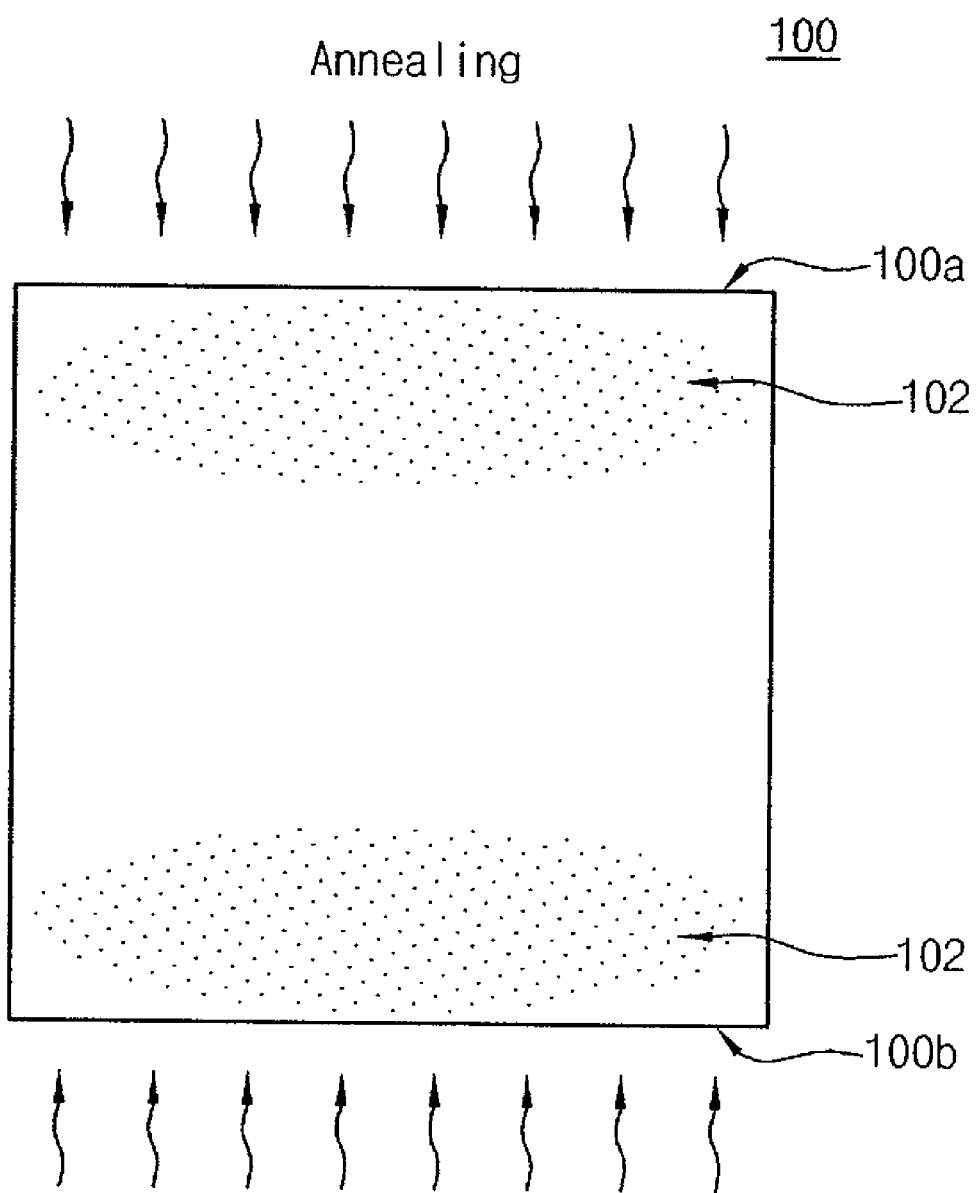
FIGS. 1 and 2 are sectional views illustrating the processes of a wafer processing method in accordance with an embodiment of the present invention.
Figure 2:
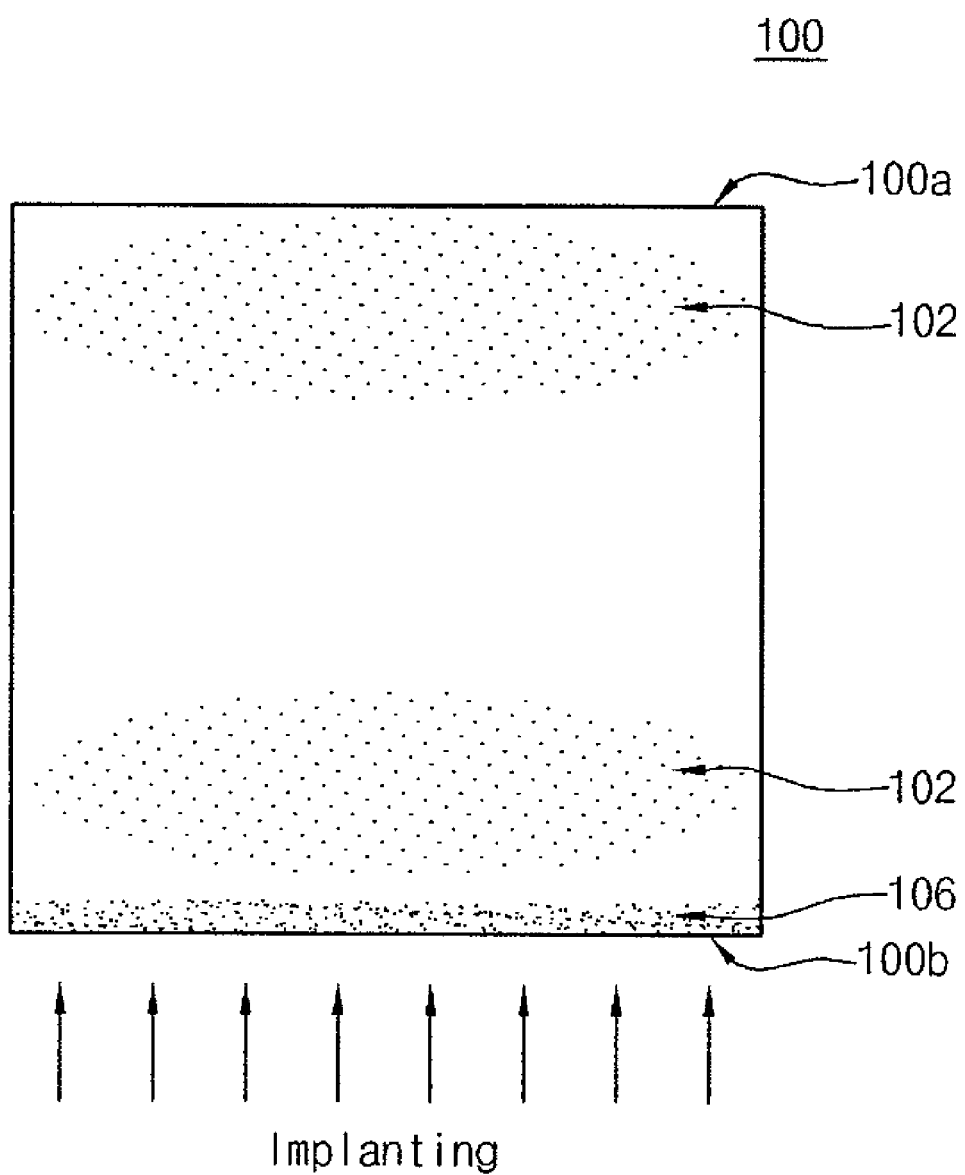

FIGS. 1 and 2 are sectional views illustrating the processes of a wafer processing method in accordance with an embodiment of the present invention.

Referring to FIG. 1, a wafer 100 is prepared from a silicon ingot by conducting a series of well-known processes. Then, annealing is conducted for the wafer 100. The annealing is conducted under an atmosphere of Ar, $N_2$ and $NH_3$ at a temperature of about 900~1,350° C. as RTA (rapid thermal annealing). By conducting the annealing, relaxation-induced gettering sites 102 are respectively formed in a front side 100a and a back side 100b of the wafer 100.

The general principle according to which the relaxation-induced gettering sites 102 are formed by the annealing is as described below.

If the wafer formed from a silicon ingot through a series of processes is annealed at a high temperature under an atmosphere of Ar, $N_2$ and $NH_3$, bonds between silicon atoms in the wafer are dissociated, and dissociated silicon atoms diffuse towards the front sides of the wafer and bond with as nitrides to form SiN layers on the front sides of the wafer.

In this state, if the wafer is quenched, the dissociated silicon atoms do not substantially diffuse anymore toward the front sides of the wafer and remain in the wafer in an elevated or saturated state. This is increase in the concentration of dissociated silicon atoms near the front side of the wafer is thought to occur because the dissociation diffusion kinetics of the silicon atoms in the wafer is higher than the formation kinetics of the SiN layers. As a result, the silicon atoms in the saturated state and bulk micro defects (BMD) tend to congregate along grain boundaries in the wafer. Consequently relaxation-induced gettering sites tend to form adjacent to the front sides of the wafer usually at the depth of approximately 10 μm from the front sides of the wafer.

Therefore, in the present invention, metal impurities can be captured using the formation of the relaxation-induced gettering sites, whereby gettering characteristics can be improved.

Referring to FIG. 2, a high concentration ion-implantation process is conducted at the back side 100b of the wafer 100 which is formed with the relaxation-induced gettering sites 102 through the annealing, so as to aid in easily capturing metal impurities in the wafer 100. The high concentration ion-implantation process is preferably conducted using boron (B). Preferably, the high concentration ion-implantation process is conducted at a concentration of about $10^{19}$~$10^{25}$ atoms/$cm^3$.

In this case, an ion-implantation site having solubility characteristics superior to other sites of the wafer 100, that is, a segregation-induced gettering site 106 is formed adjacent to the back side 100b of the wafer 100. This segregation-induced gettering site 106 is preferably formed with boron ions implanted at high concentrations and at a depth of approximately 0.25~0.80 μm from the back side 100b of the wafer 100. Accordingly, in the present invention, metal impurities in the wafer 100 can be easily captured by the segregation-induced gettering site 106 which exhibits excellent solubility characteristics for these metal impurities.

Figure 3:
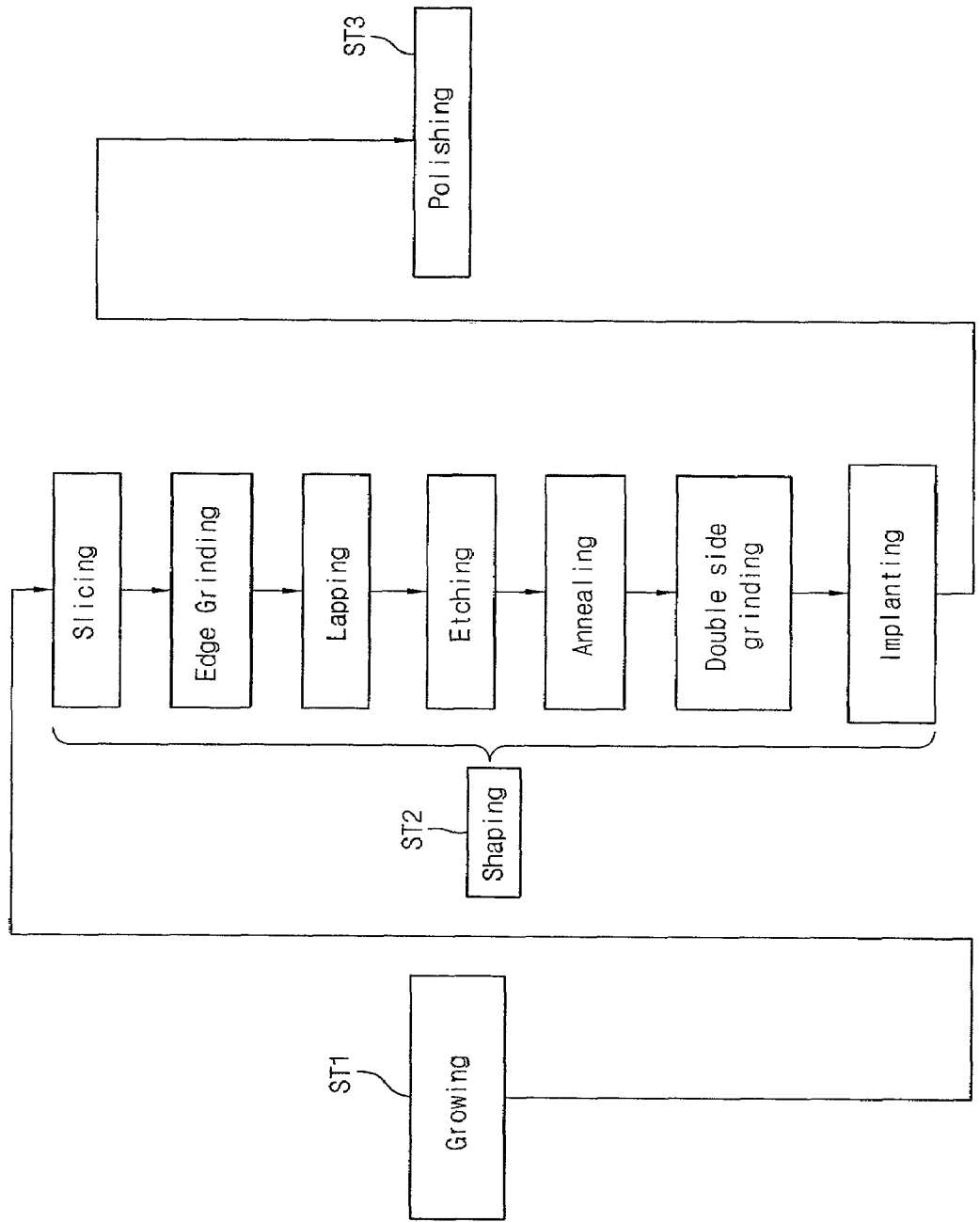
FIG. 3 is a flow chart explaining the wafer processing method in accordance with the embodiment of the present invention.

Hereinbelow, wafer forming processes for forming the relaxation-induced gettering sites and the segregation-induced gettering site will be described in detail with reference to FIG. 3.

First, after polycrystalline silicon is melted into a molten liquid state, a single crystalline silicon rod that serves as a nucleus for silicon growth is then dipped into the molten silicon. The single crystalline silicon rod is rotated and pulled away from the molten silicon so as to grow a single crystalline silicon ingot according to the Czochralski method (ST1).

Next, a shaping process (ST2) is then conducted for the silicon ingot so as to obtain a wafer. The shaping process is preferably conducted in the following sequence.

First, a slicing process is conducted for the silicon ingot. Thereupon, after the edges of the wafer are cut into rounded shapes, an edge grinding process is conducted so that the cut surfaces are rounded down. The edge grinding process is conducted to allow the wafer to better sustain physical shocks, that is, to prevent or withstand against breakage of the wafer while subsequently conducting wafer forming processes and semiconductor manufacturing processes.

Then, a lapping process is conducted to remove damage on the surfaces of the wafer which were brought about by undergoing the edge grinding process. The lapping process also aids in uniformizing the thickness and the flatness of the wafer. Thereafter, in order to remove damage and contaminants that occur on the surfaces and on the edges of the wafer brought about by the lapping process, an etching process is conducted using a wet type chemical treatment process.

Subsequently an annealing process is performed on the wafer which further removes damage and contaminants that occur on the surfaces and the edges thereof. As described above, the annealing process is preferably conducted under an atmosphere of Ar, $N_2$ and $NH_3$ at a temperature of 900~1, 350° C. using a RTA (rapid thermal annealing) process. As a result of the RTA annealing, relaxation-induced gettering sites are formed in the both sides of the wafer. Thereupon, in order to realize a desired flatness and surface roughness of the wafer, a both side grinding process is conducted for the wafer which has the formed relaxation-induced gettering sites.

Next, an ion-implantation process is conducted to form a segregation-induced gettering site on the back side of the wafer which has undergone the both side grinding process. The ion-implantation process for forming the segregation-induced gettering site is necessarily performed after the both side grinding process is conducted. This is because, if the both side grinding process is conducted for the wafer after the ion-implantation process is conducted, the segregation-induced gettering site, which comprises a high concentration ion-implantation layer formed in the back side of the wafer by the ion-implantation process, is likely to be removed while conducting the both side grinding process.

Then, a polishing process including final polishing is conducted on the front side of the wafer which is formed with the relaxation-induced gettering sites and the segregation-induced gettering site at the back side of the wafer and which has the disk shape. Through this, the formation of the wafer according to the embodiment of the present invention is substantially completed. Here, the polishing process preferably includes a final polishing step, a cleaning step and an inspection step.

It is important to note that if the ion-implantation process used for forming the segregation-induced site is conducted after the final polishing process is conducted, and then defects such as scratches on the front side of the wafer are likely to occur during the ion-implantation process. As a result, these defects cannot be removed. Therefore, it is preferred that the ion-implantation process be conducted after the both side grinding process and before the final polishing process.

As is apparent from the above description, in the present invention, after relaxation-induced gettering sites are formed in the surfaces of a wafer through high temperature annealing, segregation-induced gettering sites having high solubility are formed by an ion-implantation process at the back side of the wafer which forms with the relaxation-induced gettering sites. Thus, both the relaxation-induced and segregation-induced gettering sites are formed in one wafer.

Since both the relaxation-induced and segregation-induced gettering sites are formed in a wafer, then relaxation-induced and segregation-induced gettering characteristics can be simultaneously enhanced. Therefore, in the present invention provides gettering characteristics that are considerably improved as compared to the conventional art.

Moreover, in the present invention, because relaxation-induced and segregation-induced gettering characteristics can be simultaneously enhanced by forming both the relaxation-induced and segregation-induced gettering sites in a single wafer, not only gettering characteristics can be improved compared to the conventional art, but also the cost of the entire wafer manufacturing processes of the wafer can be reduced.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A wafer processing method comprising the steps of:
   preparing a wafer from a silicon ingot;
   annealing the wafer to form first gettering sites in both sides of the wafer; and
   ion-implanting into a back side of the wafer to form second gettering sites such that the first gettering sites and the second gettering sites are formed in the back side of the wafer.

2. The wafer processing method according to claim 1, wherein the annealing is conducted at a temperature of about 900~1,350° C.

3. The wafer processing method according to claim 1, wherein the annealing is conducted under an atmosphere of Ar, $N_2$ and $NH_3$.

4. The wafer processing method according to claim 1, wherein the annealing is conducted as a RTA (rapid thermal annealing) process.

5. The wafer processing method according to claim 1, wherein the ion-implantating is conducted using boron (B) ions.

6. The wafer processing method according to claim 5, wherein the ion-implantating is conducted only at the back side of the wafer.

7. The wafer processing method according to claim 1, wherein the ion-implantating is conducted to provide a concentration of impurities at about $10^{19}10^{25}$ atoms/cm$^3$.

8. The wafer processing method according to claim 1, wherein the second gettering site is formed at a depth of approximately 0.25~0.80 µm from the back side of the wafer.

9. The wafer processing method according to claim 1, further comprises the step of conducting a both side grinding process for the wafer formed with the first gettering sites wherein, the conducting step is performed after the annealing step and before the ion implanting step.

10. The wafer processing method according to claim 1, further comprises the step of polishing a front side of the wafer that already has the second gettering sites in the back side.

* * * * *